(12) United States Patent
Yoshida

(10) Patent No.: US 6,285,069 B1
(45) Date of Patent: Sep. 4, 2001

(54) SEMICONDUCTOR DEVICE HAVING IMPROVED PARASITIC CAPACITANCE AND MECHANICAL STRENGTH

(75) Inventor: Hiroshi Yoshida, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/289,594

(22) Filed: Apr. 12, 1999

(30) Foreign Application Priority Data

Apr. 10, 1998 (JP) .................................................. 10-099743

(51) Int. Cl.⁷ .................................................. H01L 29/00
(52) U.S. Cl. .................................................. 257/531; 257/528
(58) Field of Search .................................. 257/758, 379, 257/381, 516, 528, 531, 904, 924; 438/200, 210, 329

(56) References Cited

U.S. PATENT DOCUMENTS 5,567,982 * 10/1996 Bartelink .............................. 257/664
5,863,832 * 1/1999 Doyle et al. .......................... 438/622

FOREIGN PATENT DOCUMENTS

| 62-244160 | * 10/1987 | (JP) . |
| 1-246850 | 10/1989 | (JP) . |
| 7-122710 | 5/1995 | (JP) . |
| 8-83839 | 3/1996 | (JP) . |
| 9-205178 | 8/1997 | (JP) . |

* cited by examiner

Primary Examiner—Steven Loke
Assistant Examiner—Hung Kim Vu
(74) Attorney, Agent, or Firm—Young & Thompson

(57) ABSTRACT

A cavity structure formed in a semiconductor substrate and under a device formation region on which a device is formed. The cavity structure has supporting pillars providing the device formation region with mechanical strength.

18 Claims, 20 Drawing Sheets

US 6,285,069 B1

SEMICONDUCTOR DEVICE HAVING IMPROVED PARASITIC CAPACITANCE AND MECHANICAL STRENGTH

BACKGROUND OF THE INVENTION

The present invention relates to a semiconductor device, and more particularly to a semiconductor device having an integration of passive devices or passive and active devices on a single semiconductor substrate, wherein the passive device has at least a conductive layer having a reduced parasitic capacitance to the substrate and also relates to improvements for the semiconductor device to have high resistance to pressure and vibration.

In recent years, it has been proposed that in addition to active devices such as MOS field effect transistors and bipolar transistors, passive devices such as inductors and capacitors be integrated on the same LSI chip. The formation of the passive device on the silicon substrate may raise the problem in deterioration of electric characteristics of the passive devices due to a parasitic capacitance between the silicon substrate and conductive layer in the passive device. In Japanese laid-open patent publication No. 7-122710, it is disclosed to form a deep cavity in the silicon substrate under the passive device formation region on which the passive device will be formed. In Symposium on VLSI Technology Digest of Technical Papers, 1996 D. Hisamoto et al, it is addressed that an inductor device as the passive device is integrated on the silicon substrate. This conventional technique will be described in detail with reference to FIGS. 1, 2 and 3. FIG. 1 is a fragmentary cross sectional elevation view illustrative of a conventional semiconductor device having an inductive device as a passive device on a silicon substrate. FIG. 2 is a cross sectional plan view illustrative of a silicon substrate on which an inductive device as a passive device is integrated to form the conventional semiconductor device of FIG. 1 which is a cross sectional elevation view taken along a I–I' line of FIG. 2. FIG. 3 is a plan view illustrative of the conventional semiconductor device of FIG. 1, which is a cross sectional elevation view taken along I–I' line of FIG. 3.

A cavity 72 is formed in a silicon substrate 61. A silicon oxide film 65 is formed on a surface of the silicon substrate so that the bottom of the silicon oxide film 65 defines an upper boundary of the cavity 72. An inter-layer insulator 67 is formed on the silicon oxide layer 65. A first level interconnection 66 is formed on the silicon oxide film 65 and within the inter-layer insulator 67. A contact plug 68 is formed on the first level interconnection 66 and within the inter-layer insulator 67. Second level interconnections 70 are formed on the inter-layer insulator 67. A through hole 71 is formed which penetrate both the inter-layer insulator 67 and the silicon oxide layer 65 so that the through hole 71 reaches the cavity 72 formed in the silicon substrate 61. An inductor device 76 comprising the first and second level interconnections 66 and 70 is thus formed over the cavity 72 formed in the silicon substrate 61. Namely, the cavity 72 extends under the entire of the inductor device formation region on which the inductor device 76 is formed. The cavity 72 reduces the parasitic capacitance between the silicon substrate 61 and the first and second level interconnections 66 and 70, thereby improving frequency characteristics of the inductor device 76. Namely, the high frequency performance of the inductor device is improved by the cavity 72. The inductor device has an inductance in the range of 7.6–7.7 nH and also improves the resonant frequency from 8.7 GHz to 19.6 GHz, namely the resonant frequency is increased by two times or more.

The inductance "L" of the inductor device depends upon the external dimension "X" and the number of winding "n" as well as a width "W" of the interconnections and a pitch "S" of the interconnections. FIG. 4 is a diagram illustrative of a dependency of an inductance "L" upon the external dimension "X" of the inductor device, where the width "W" and the pitch "S" of the interconnections are 20 micrometers and the number of windings "n" is 3.5.

In order to obtain the inductance in the range of 7.6–7.7 nH, it is necessary that the external dimension "X" of the inductor device be 500 micrometers and that the cavity size be 500 micrometers by 500 micrometers. If vibration and pressure are applied to the semiconductor device, the silicon oxide film 65 and the inter-layer insulator 67 may be broken, whereby the inductor device 76 is dropped into the cavity 72 formed in the silicon substrate 61.

In the above circumstances, it was required to develop a novel semiconductor device having an integration of passive devices or passive and active devices on a single semiconductor substrate, wherein the passive device has at least a conductive layer having a reduced parasitic capacitance to the substrate and also the semiconductor device is improved in mechanical strength against external mechanical forces such as pressure and vibration.

SUMMARY OF THE INVENTION

Accordingly, it is an object of the present invention to provide a novel semiconductor device having an integration of passive devices or passive and active devices on a single semiconductor substrate free from the above problems.

It is a further object of the present invention to provide a novel semiconductor device having an integration of passive devices or passive and active devices on a single semiconductor substrate, wherein characteristics and performance of the passive device are improved.

It is a still further object of the present invention to provide a novel semiconductor device having an integration of passive devices or passive and active devices on a single semiconductor substrate, wherein high frequency performance of the inductor device is improved.

It is yet a further object of the present invention to provide a novel semiconductor device having an integration of passive devices or passive and active devices on a single semiconductor substrate, wherein mechanical strength of the semiconductor device against external forces such as pressure and vibration are improved.

It is a further object of the present invention to provide a novel method of forming a semiconductor device having an integration of passive devices or passive and active devices on a single semiconductor substrate free from the above problems.

It is still another object of the present invention to provide a novel method of forming a semiconductor device having an integration of passive devices or passive and active devices on a single semiconductor substrate, wherein characteristics and performance of the passive devices are improved.

It is moreover an object of the present invention to provide a novel method of forming a semiconductor device having an integration of passive devices or passive and active devices on a single semiconductor substrate, wherein high frequency performance of an inductor device is improved.

It is another object of the present invention to provide a novel method of forming a semiconductor device having an integration of passive devices or passive and active devices on a single semiconductor substrate, wherein mechanical strength of the semiconductor device against external forces such as pressure and vibration is improved.

The present invention provides a cavity structure formed in a semiconductor substrate and under a passive device formation region on which a passive device is formed, wherein the cavity structure has at least one of supporting pillars and supporting walls for providing the passive device formation region with a mechanical strength.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
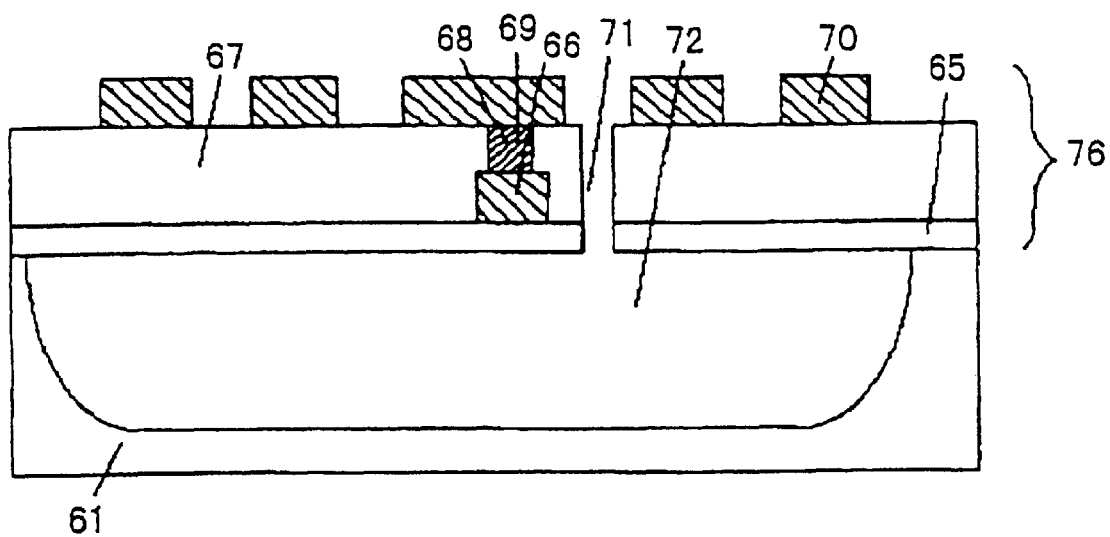
FIG. 1 is a fragmentary cross sectional elevation view taken along I–I' in FIG. 2 illustrative of a conventional semiconductor device having an inductive device as a passive device on a silicon substrate.
Figure 2:
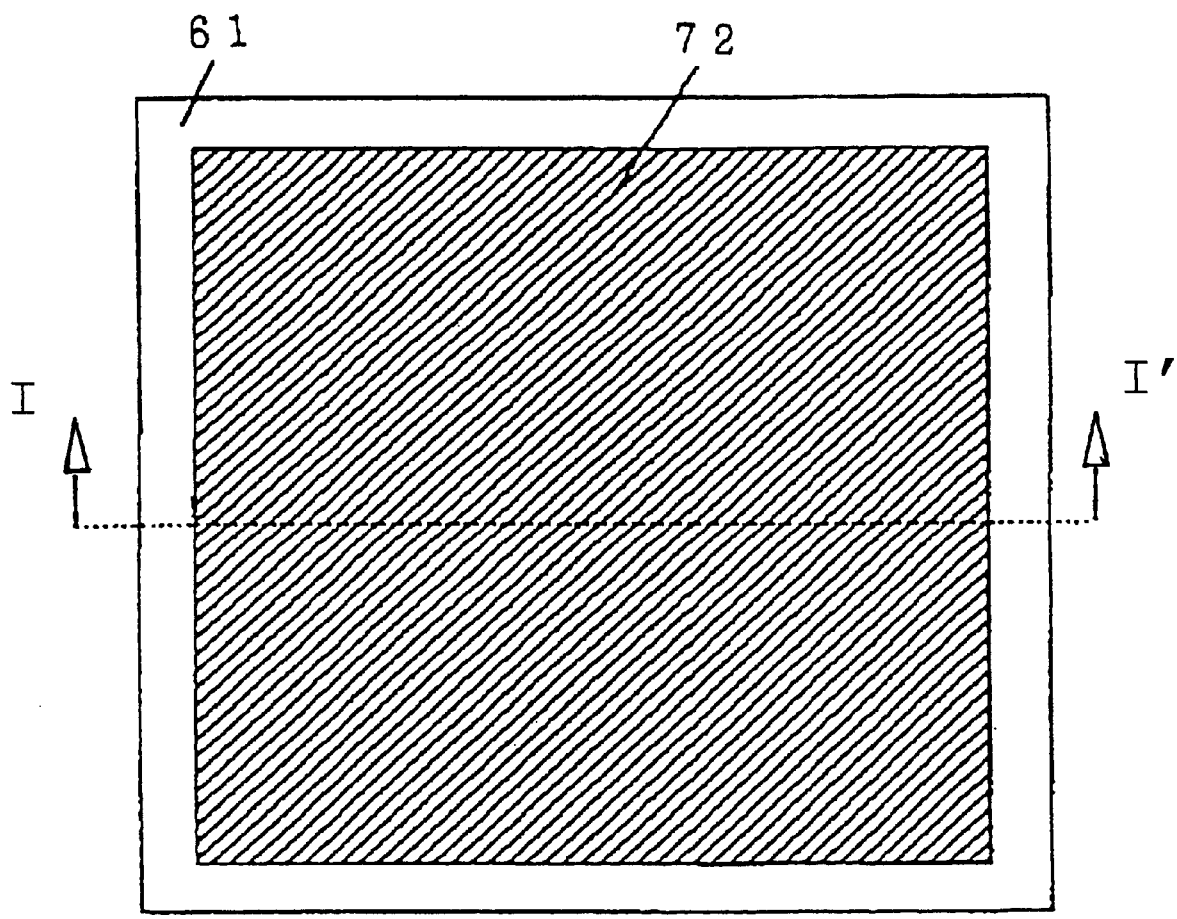
FIG. 2 is a cross sectional plan view illustrative of a silicon substrate on which an inductive device as a passive device is integrated to form the conventional semiconductor device of FIG. 1.
Figure 3:
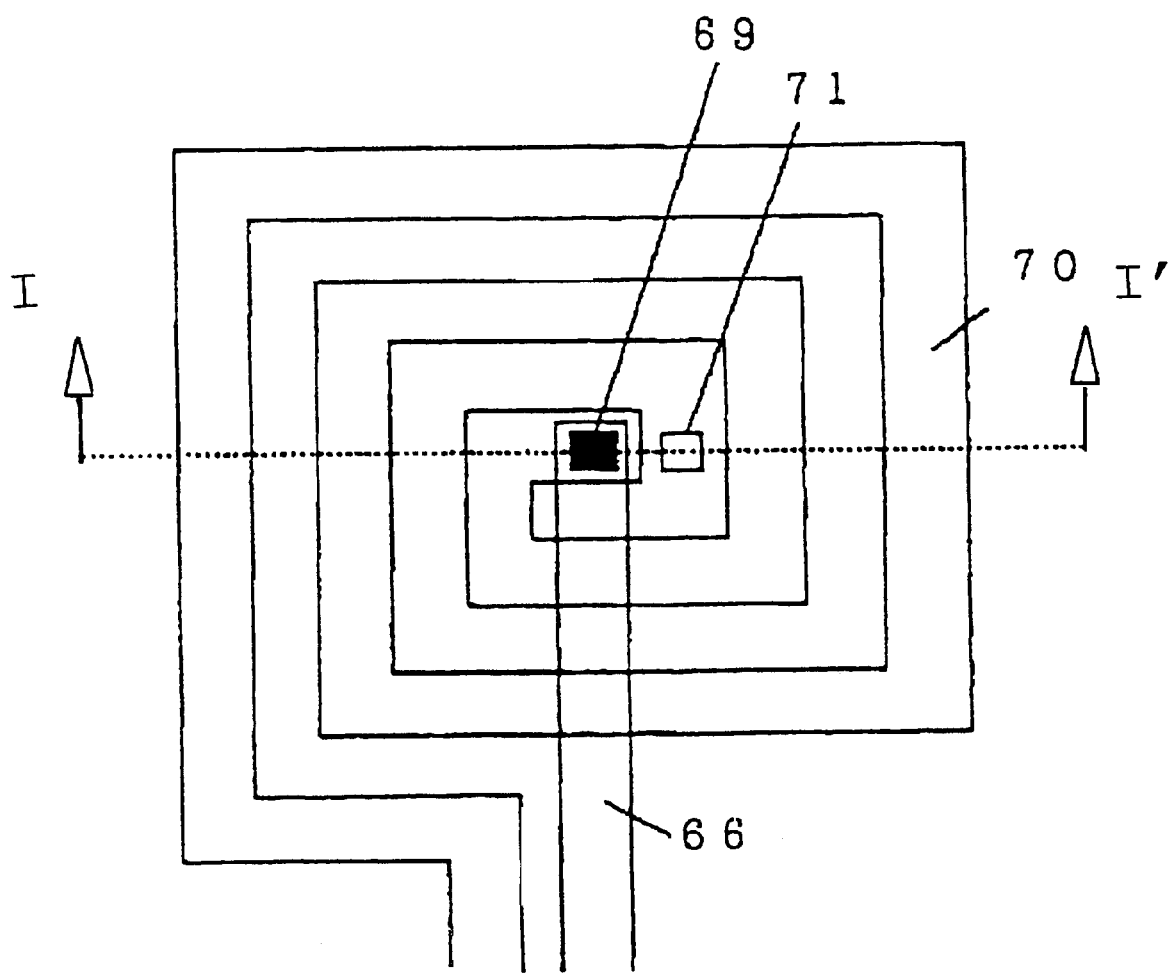
FIG. 3 is a plan view illustrative of the conventional semiconductor device of FIG. 1.
Figure 4:
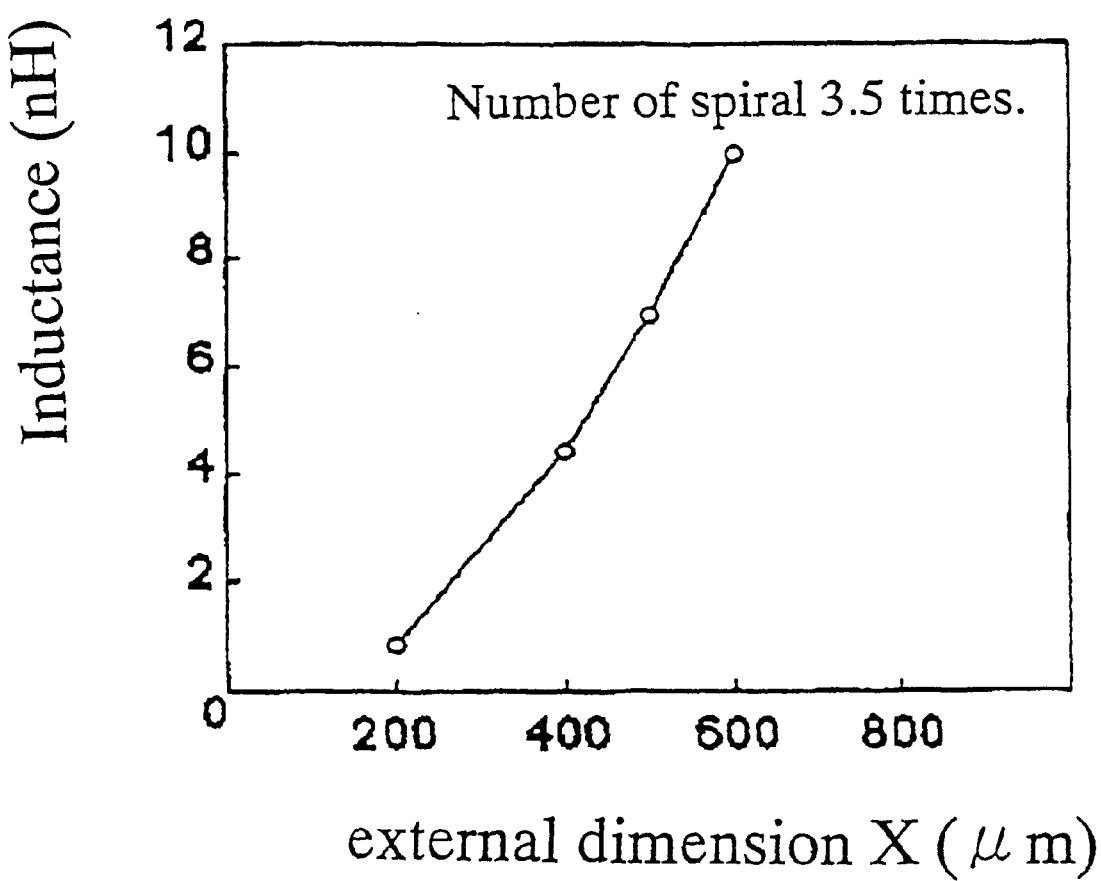
FIG. 4 is a diagram illustrative of a dependency of an inductance "L" upon the external dimension "X" of the inductor device, where the width "W" and the pitch "S" of the interconnections are 20 micrometers, and the number of winding "n" is 3.5.

The first embodiment of the present invention provides a cavity structure formed in a semiconductor substrate and under a passive device formation region on which a passive device is formed, wherein the cavity structure has at least one of supporting pillars and supporting walls for providing the passive device formation region with a mechanical strength.

It is preferable that the at least one of the supporting pillars and the supporting walls comprises an extending portion of the semiconductor substrate so that the at least one of the supporting pillars and the supporting walls is united with the semiconductor substrate and is made of the same semiconductor material as the semiconductor substrate.

It is also preferable that the at least one of the supporting pillars and the supporting walls comprises a separate portion from the semiconductor substrate separated by an insulating layer so that the at least one of the supporting pillars and the supporting walls is electrically isolated by the insulating layer from the semiconductor substrate.

It is also preferable that the separate portion is made of the same semiconductor material as the semiconductor substrate.

It is further preferable that the separate portion be made of a different material from the semiconductor substrate.

It is further preferable that a distribution of the supporting pillars be generally symmetrical in a plan view of the semiconductor substrate.

It is further more preferable that each of the supporting pillars be square-shaped in cross sectional plan view.

It is moreover preferable that a distribution of the supporting walls be generally symmetrical in a plan view of the semiconductor substrate.

The above novel cavity structure is applicable to a semiconductor device having an integration of at least one active device and at least one passive device on a single semiconductor substrate, wherein the single semiconductor substrate has a cavity structure as discussed herein.

It is preferable that a through hole be formed directly over a part of the cavity structure, except for the at least one of the supporting pillars and the supporting walls.

The second embodiment of the present invention provides a cavity structure formed in a semiconductor substrate and under a passive device formation region on which a passive device is formed, wherein the cavity structure comprises a plurality of distributed cavities extending in an upper portion of the semiconductor substrate, so that each of the distributed cavities is surrounded by the upper portion of the semiconductor substrate and positioned over a body of the semiconductor substrate.

It is also preferable that the upper portion of the semiconductor substrate be united with the body of the semiconductor substrate and be made of the same semiconductor material as the body of the semiconductor substrate.

It is also preferable that the upper portion be separated by an insulating layer from the body of the semiconductor substrate, so that the upper portion is electrically isolated by the insulating layer from the body of the semiconductor substrate.

It is also preferable that a distribution of the distributed cavities be generally symmetrical in a plan view of the semiconductor substrate.

It is also preferable that each of the distributed cavities be square-shaped in a cross sectional plan view.

The above novel cavity structure of the second present invention is applicable to a semiconductor device having an integration of at least one active device and at least one passive device on a single semiconductor substrate, wherein the single semiconductor substrate has a plurality of cavity structure as discussed herein.

It is also preferable that at least a through hole is formed directly over a part of the cavity structure, except not over the supporting pillars and the supporting walls.

The third embodiment of the present invention provides a method of forming at least one cavity in a semiconductor substrate and on a passive device formation region on which a passive device is formed. The method comprises the steps of: selectively forming at least one groove in the semiconductor substrate; filling the at least one groove with a coating film; forming an insulation layer which extends over a top surface of the semiconductor substrate and a top surface of the coating film; forming an inter-layer insulator on the insulation layer; forming at least a through hole in the inter-layer insulator and the insulation layer so that the through hole reaches a part of the coating film; and subjecting the coating film to a wet etching through the through hole to remove the coating film from the at least one groove, thereby forming the at least one cavity.

It is also preferable that the insulation layer have a thickness in the range of 500–2000 nanometers.

It is also preferable that the at least one groove have a depth of about 100 micrometers.

It is also preferable that the coating film comprise a spin-on-glass film.

It is also preferable that the inter-layer insulator have a thickness in the range of 500–2000 nanometers.

It is also preferable that a plurality of through holes be formed.

It is also preferable that the wet etching is carried out by use of an etchant comprising a buffered hydrofluoric acid.

The above semiconductor substrate may be a silicon substrate or any of compound semiconductor substrates such as a GaAs substrate formed thereon with hetero-junction bipolar transistor circuits or high electron mobility transistor circuits. The passive device may comprise an inductor, a capacitor, or a resistor.

The above cavity structure may have a meshed pattern shape in plan view. A volume of the cavity structure may be decided in consideration of the necessary mechanical strength of the semiconductor device.

Figure 5:
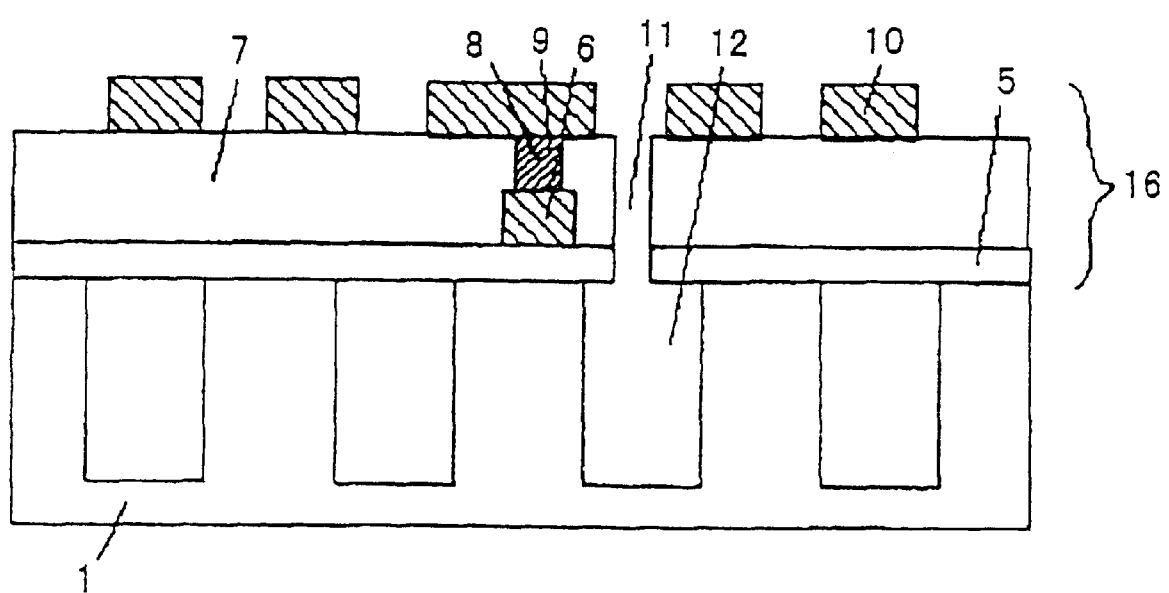
FIG. 5 is a fragmentary cross sectional elevation view taken along V–V' of the FIGS. 6 and 7 illustrative of a novel semiconductor device having an inductive device as a passive device on a silicon substrate in a first embodiment in accordance with the present invention.
Figure 6:
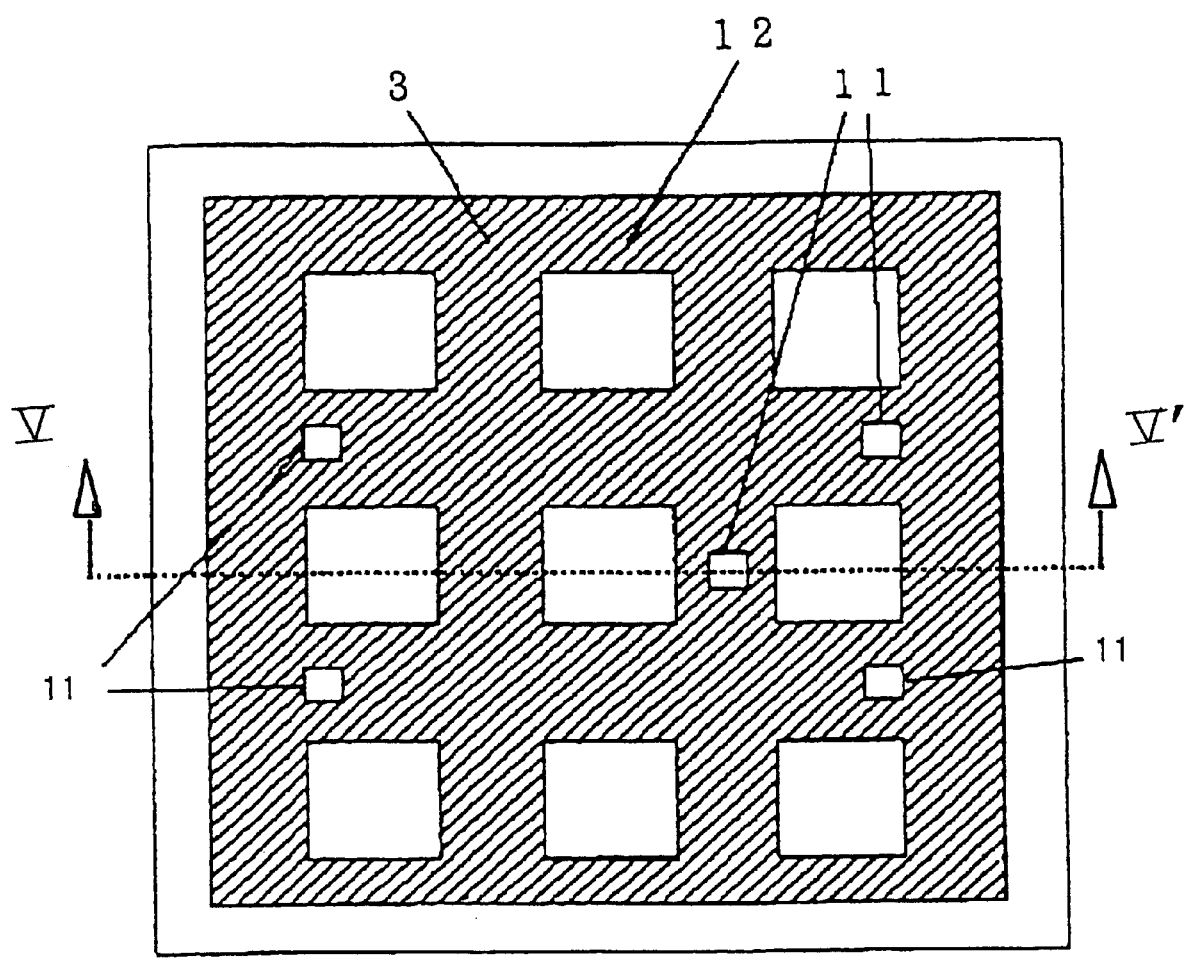
FIG. 6 is a cross sectional plan view illustrative of a silicon substrate on which an inductive device as a passive device is integrated to form the novel semiconductor device of FIG. 5 in a first embodiment in accordance with the present invention.
Figure 7:
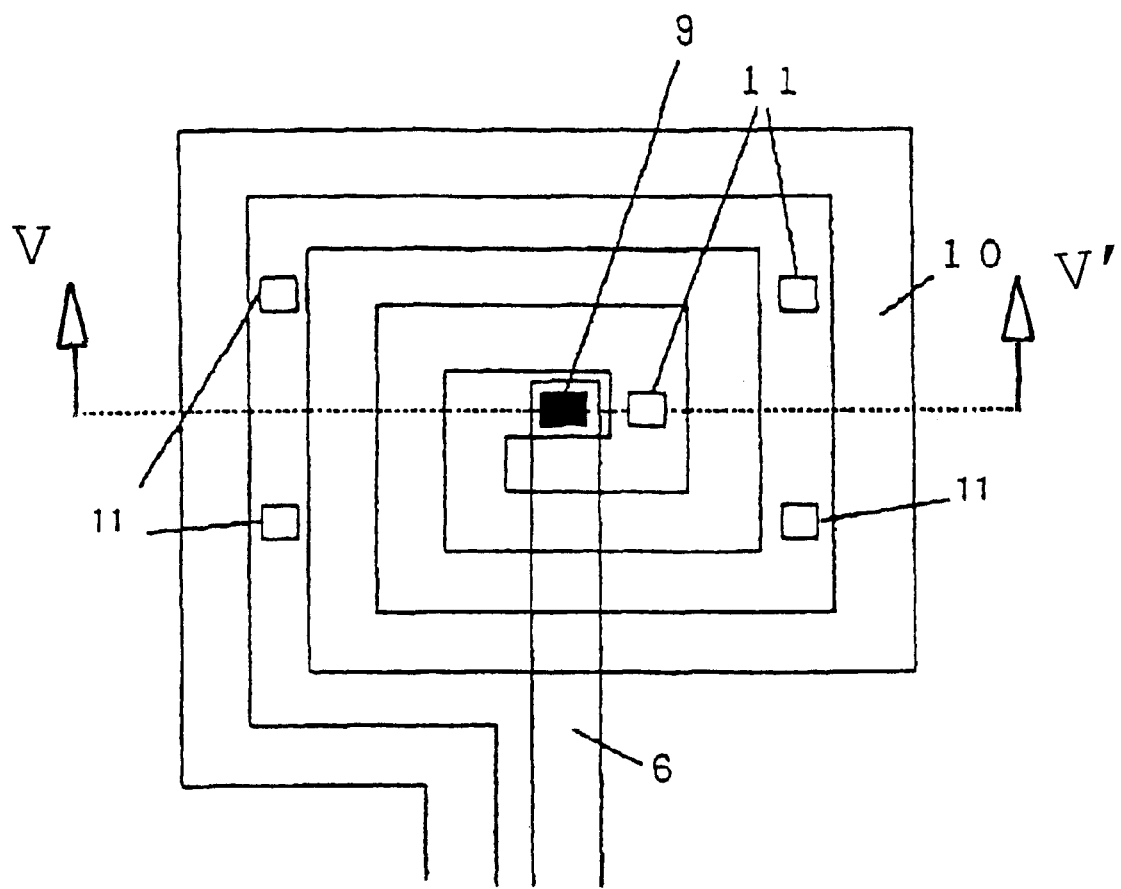
FIG. 7 is a plan view illustrative of the novel semiconductor device of FIG. 5 in a first embodiment in accordance with the present invention.

A first embodiment according to the present invention will be described in detail with reference to FIGS. 5, 6 and 7.

A cavity 12 is formed in a silicon substrate 1. A silicon oxide film 5 is formed on a surface of the silicon substrate 1 so that the bottom of the silicon oxide film 5 defines an upper boundary of the cavity 12. An inter-layer insulator 7 is formed on the silicon oxide layer 5. A first level interconnection 6 is formed on the silicon oxide film 5 and within the inter-layer insulator 7. A tungsten contact plug 9 is formed on the first level interconnection 6 and within the inter-layer insulator 7. Second level interconnections 10 are formed on the inter-layer insulator 7. A through hole 11 is formed which penetrates both the inter-layer insulator 7 and the silicon oxide layer 5 so that the through hole 1 reaches the cavity 12 formed in the silicon substrate 11. An inductor device 16 comprising the first and second level interconnections 6 and 10 as well as the contact plug 8 is thus formed over the cavity 12 formed in the silicon substrate 11. Namely, the cavity 12 extend under the entire inductor device formation region on which the inductor device 16 is formed. The cavity 12 reduces the parasitic capacitance between the silicon substrate 1 and the first and second level interconnections 6 and 10, thereby improving frequency characteristics of the inductor device 16. Namely, the high frequency performance of the inductor device 16 is improved by the cavity 12. The second level interconnection extends in a spiral over the inter-layer insulator. The cavity 12 has a depth of about 100 micrometers. The cavity 12 extends in the form of a mesh so that the meshed shape of the cavity 12 defines squared pillar portions of the silicon substrate 1 which are symmetrically distributed in a matrix form. The through hole 11 reaches the cavity 12. Each of the square-shaped pillar portions of the silicon substrate 1 has a size of 10 micrometers by 10 micrometers. A distance between two adjacent square-shaped pillar portions of the silicon substrate 1 is 50 micrometers. The square-shaped pillar portions of the silicon substrate 1 are formed in 7 by 7 matrix so that a total number of the square-shaped pillar portions is 49. An area of the cavity 12 is calculated to be 245100 micrometers squares (=500×500−49×10×10) which is almost the same as the area (250000 micrometers squares= 500×500) of the conventional cavity structure as illustrated in FIG. 1. The reduction of the parasitic capacitance of the semiconductor device depends upon a ratio of the area of the cavity to the square-shaped pillar portions of the silicon substrate 1, for which reason the above novel semiconductor device has an improved cavity structure and is capable of exhibiting almost the same resonant frequency as the conventional semiconductor device. Further, the square-shaped pillar portions of the silicon substrate 1 provides the semiconductor device with a large mechanical strength which prevents the semiconductor device from being broken due to external application of pressure and vibration to the semiconductor device.

The following descriptions will focus on the novel method of forming the above novel semiconductor device with reference to FIGS. 8A through 8E.

Figure 8A:
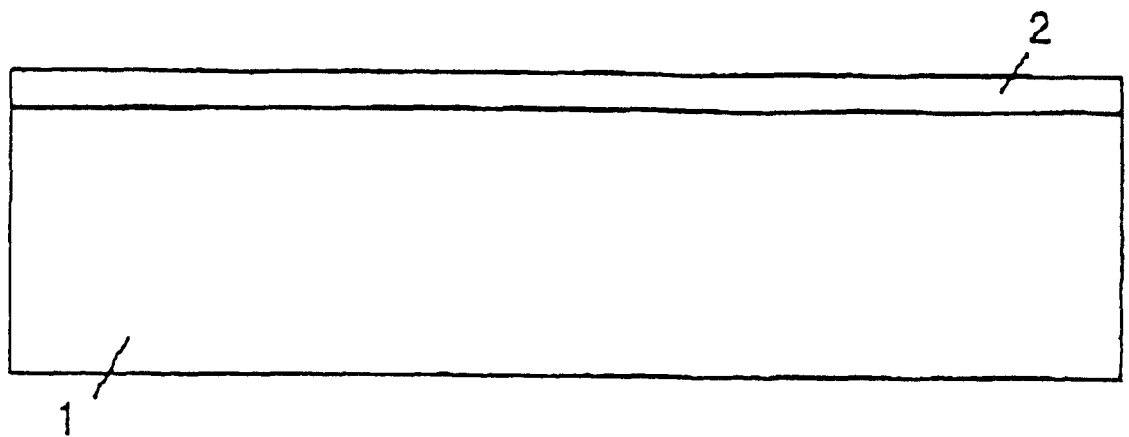
FIGS. 8A through 8E are fragmentary cross sectional elevation views illustrative of semiconductor devices in sequential steps involved in a fabrication method in a first embodiment in accordance with the present invention.

With reference to FIG. 8A, a first oxide film 2 having a thickness of 500–1000 nanometers is formed on a silicon substrate 1.

Figure 8B:
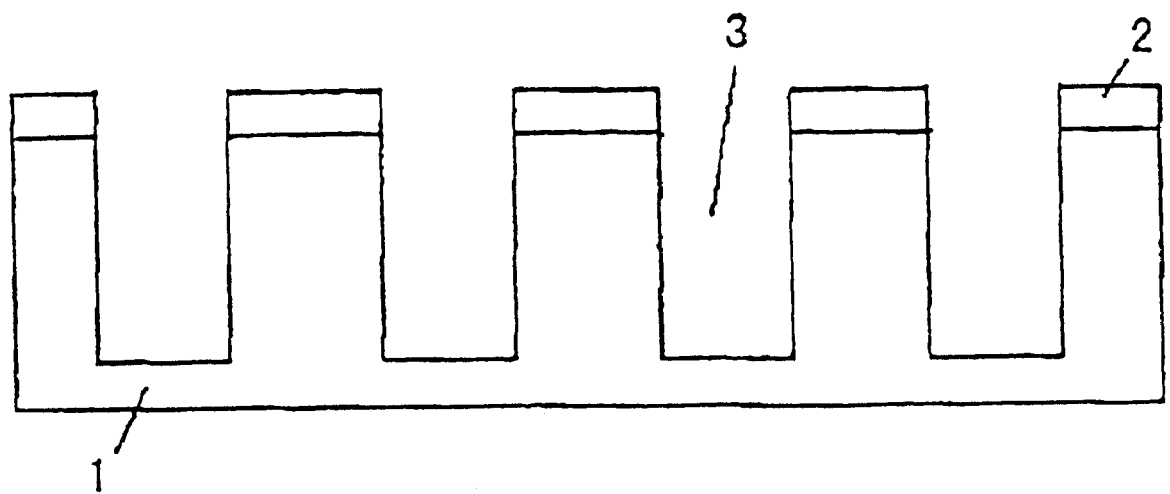

With reference to FIG. 8B, a photo-resist is formed on the first oxide film 2 to carrying out a dry etching to the first oxide film 2 by use of the photo-resist as a mask. The used photo-resist is removed. Subsequently, the first oxide film 2 is used as a mask to carry out a dry etching to the silicon substrate 1 to form a trench groove 3 having a width of about 100 micrometers. The trench groove 3 has a mesh-like shape in a plan view which defines a 7×7 matrix-distribution of the squared pillar portions of the silicon substrate 1.

Figure 8C:
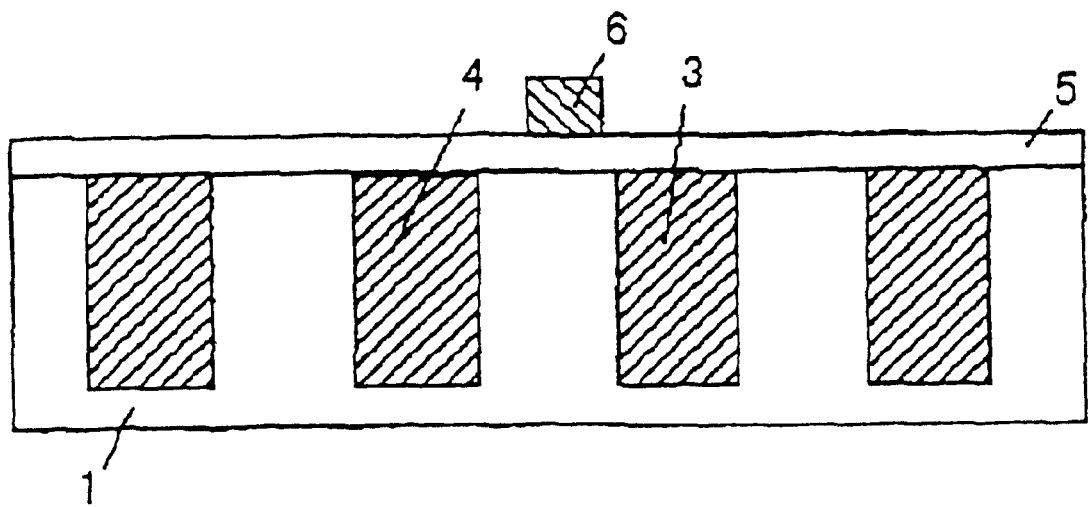

With reference to FIG. 8C, a coating film 4 is filled in the trench groove 3. The coating film 4 may be a spin on glass film. Subsequently, a second oxide film 5 having a thickness of 500–2000 nanometers is formed which extends over the coating film 4 and the top surfaces of the squared pillar portions of the silicon substrate 1. A first level interconnection layer 6 is formed on the second oxide film 5.

Figure 8D:
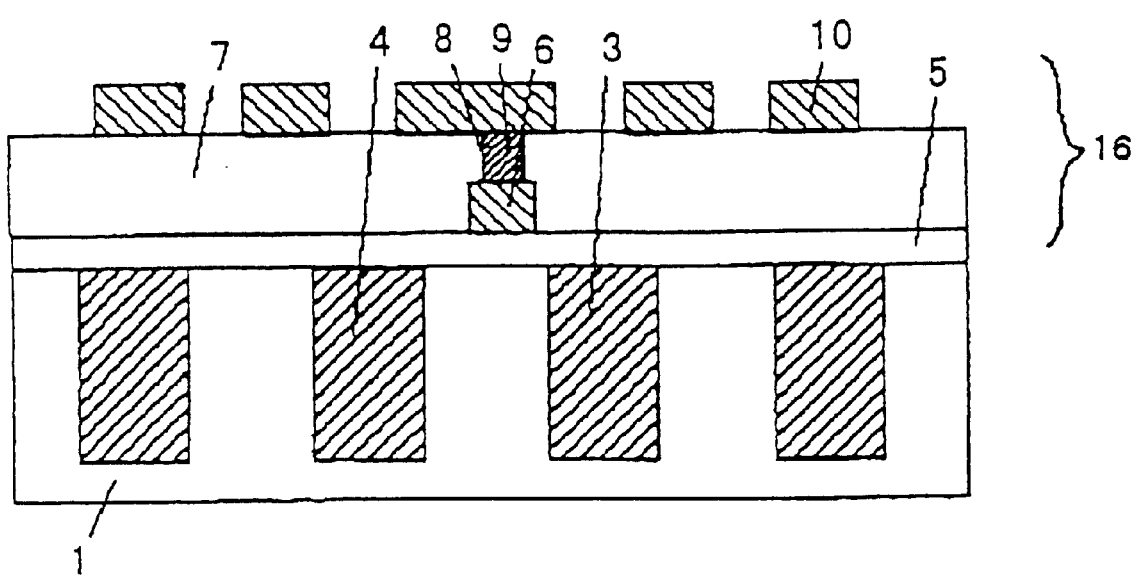

With reference to FIG. 8D, an inter-layer insulator 7 having a thickness of 1000–2000 nanometers is formed on the second oxide film 5 and the first level interconnection layer 6. A surface of the inter-layer insulator 7 is then polished to planarize the surface thereof. A contact hole 8 is formed in the inter-layer insulator 7 so that the contact hole 8 is positioned over the first level interconnection layer 6 and reaches the first level interconnection layer 6. Tungsten is filled into the contact hole 8 to form a tungsten contact plug 9 in the contact hole 8 so that the tungsten contact plug 9 is in contact with the first level interconnection layer 6. A second level interconnection 10 is formed on the inter-layer insulator 7 so that the second level interconnection is in contact with the tungsten contact plug 9, whereby the second level interconnection 10 is electrically connected through the tungsten contact plug 9 to the first level interconnection layer 6. As a result, an inductor device 16 is formed which comprises the first level interconnection layer 6, the second level interconnection 10 and the tungsten contact plug 9.

Figure 8E:
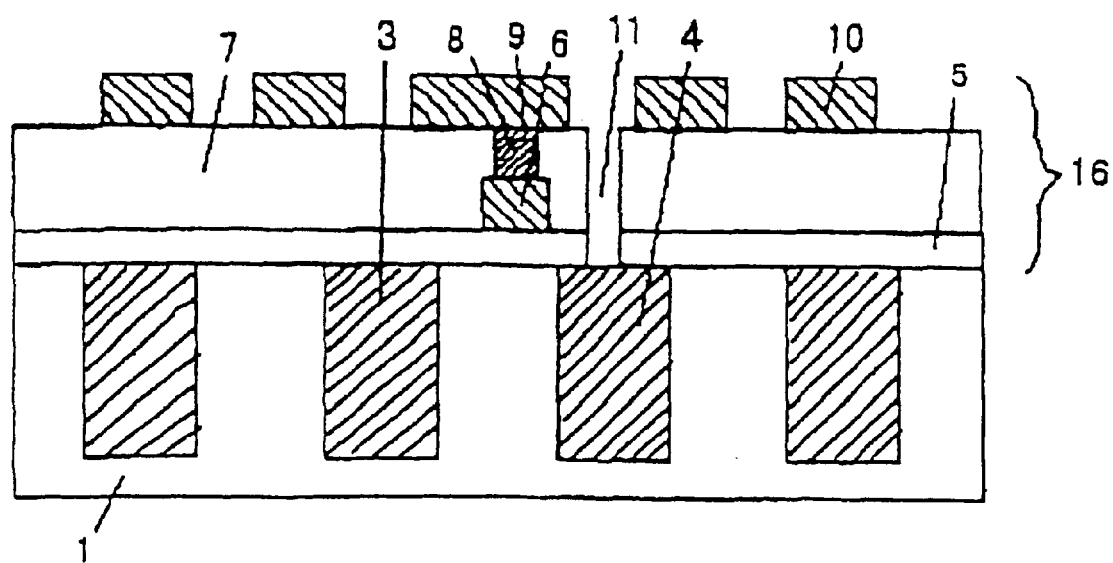

With reference to FIG. 8E, a through hole 11 is formed in the inter-layer insulator 7 and the second oxide film 5 so that the through hole 11 is positioned over the coating film 4 within the groove 3, whereby the coating film 4 within the groove 3 is shown through the through hole 11. A wet etching of the coating film 4 within the groove 3 is carried out through the through hole 11 by use of a buffered hydrofluoric acid as an etchant. An etching rate of the inter-layer insulator 7 is about 100 times slower than the coating film 4, therefore only the coating film 4 is selectively etched. Actually, the through hole 11 is enlarged in size by about 1 micrometer through the wet etching process. It is preferable that a plurality of through holes 11 be formed in the inter-layer insulator 7 so that the etchant is likely to entirely etch the coating film 4 in the trench groove 3, whereby the coating film 4 is removed from the trench groove and the cavity is formed under the inductor device 16.

Namely, the cavity 12 extends completely under the inductor device formation region on which the inductor device 16 is formed. The cavity 12 has a depth of about 100 micrometers. The cavity 12 extends in the form of a mesh so that the meshed shape of the cavity 12 defines squared pillar portions of the silicon substrate 1 which are symmetrically distributed in a matrix form. The cavity 12 reduces the parasitic capacitance between the silicon substrate 1 and the first and second level interconnections 6 and 10, thereby improving frequency characteristics of the inductor device 16. Namely, the high frequency performance of the inductor device 16 is improved by the cavity 12. The reduction of the parasitic capacitance of the semiconductor device depends upon the ratio of the area of the cavity 12 to the square-shaped pillar portions of the silicon substrate 1, for which reason the above novel semiconductor device having an improved cavity structure is capable of exhibiting almost the same resonant frequency as the conventional semiconductor device. Further, the square-shaped pillar portions of the silicon substrate 1 provides the semiconductor device with a large mechanical strength which prevents the semiconductor device from being broken due to external application of pressure and vibration to the semiconductor device. The region of the cavity 12 is defined by the anisotropic etching or the dry etching, and is possible to realize a precise control in area of the cavity 12, thereby enabling the reduction of the parasitic capacitance of the semiconductor device. Therefore, the resonant frequency or the high frequency performance of the semiconductor device is precisely controllable.

Figure 9:
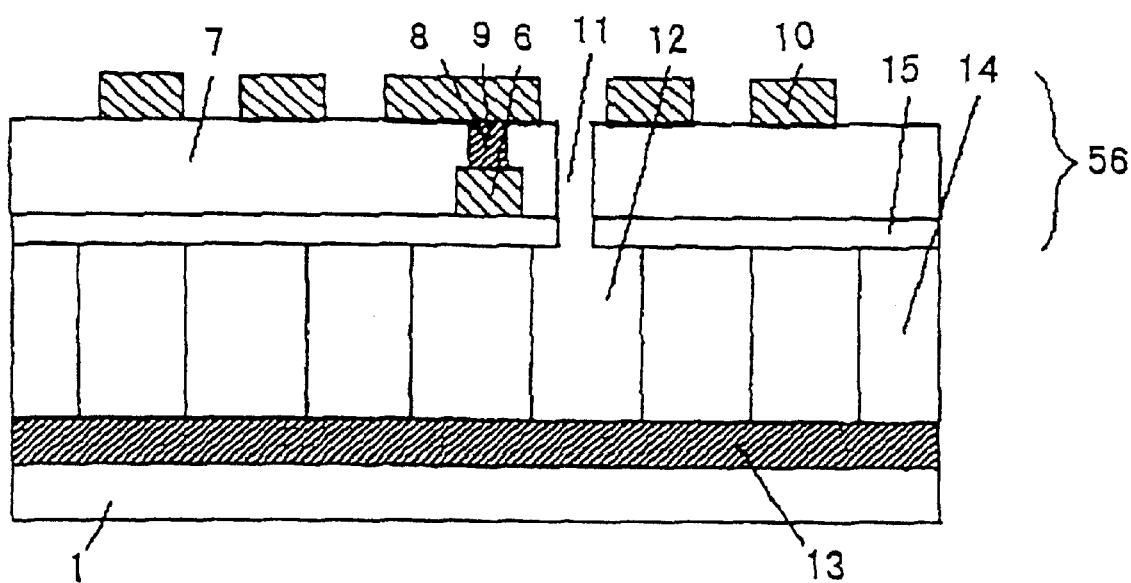
FIG. 9 is a fragmentary cross sectional elevation view taken along IX–IX' of FIGS. 10 and 11 illustrative of another novel semiconductor device having an inductive device as a passive device on a silicon substrate in a second embodiment in accordance with the present invention.
Figure 10:
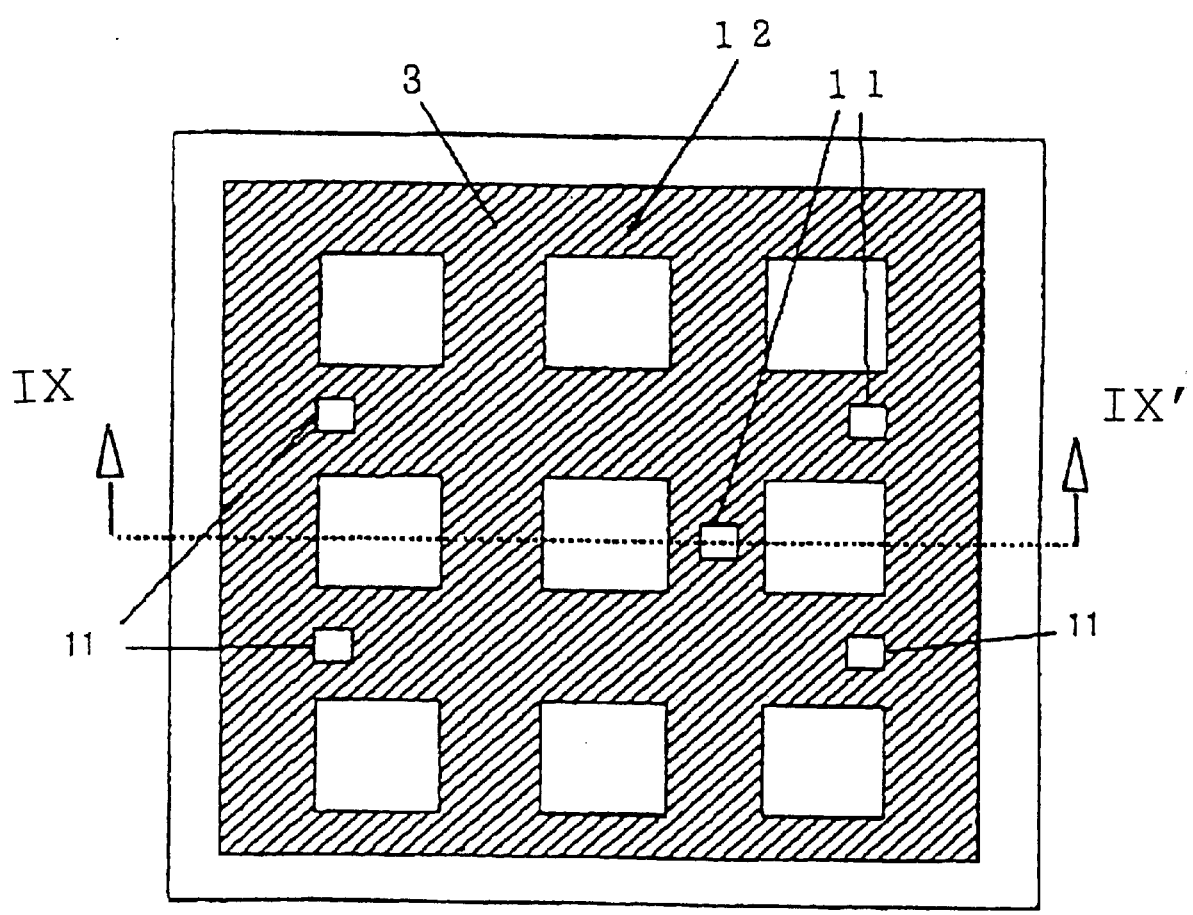
FIG. 10 is a cross sectional plan view illustrative of a silicon substrate on which an inductive device as a passive device is integrated to form the other novel semiconductor device of FIG. 9 in a second embodiment in accordance with the present invention.
Figure 11:
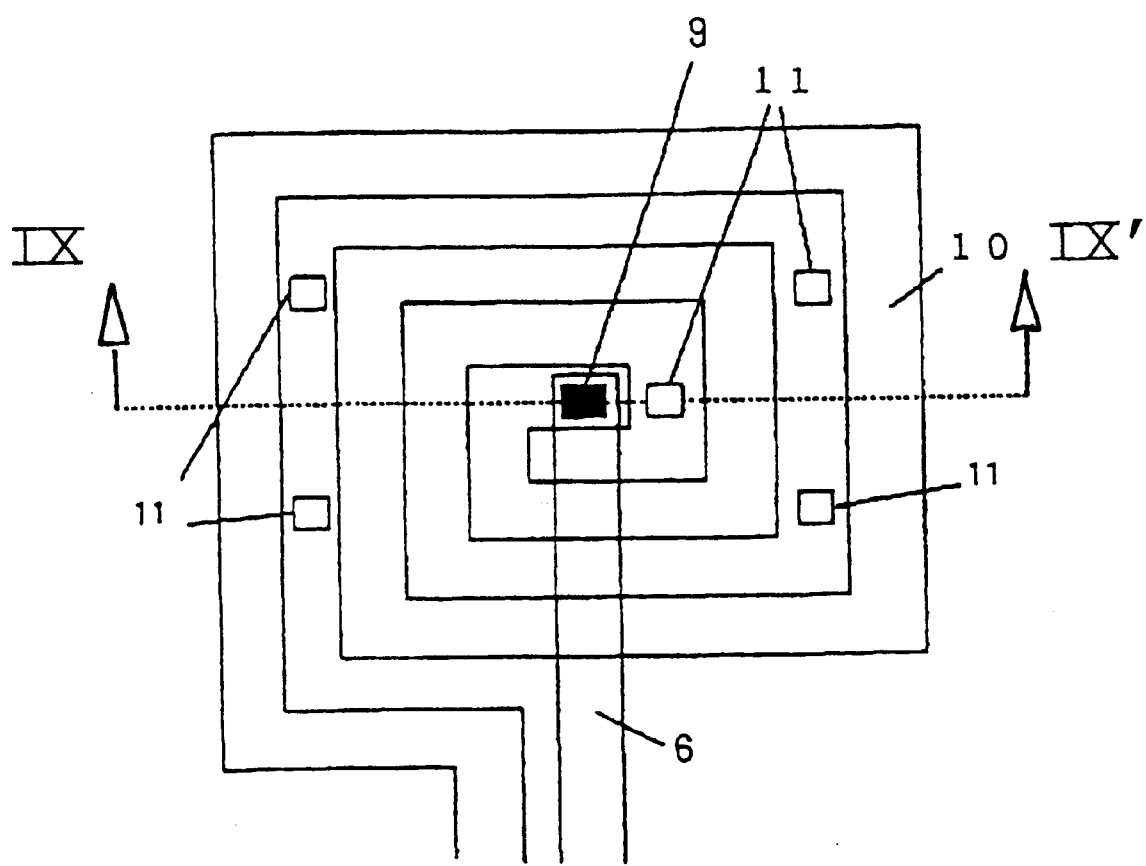
FIG. 11 is a plan view illustrative of the novel semiconductor device of FIG. 9 in a second embodiment in accordance with the present invention.

A second embodiment according to the present invention will be described in detail with reference to FIGS. 9, 10 and 11.

A cavity 12 is formed over an insulating layer 13 and in a silicon layer 14 over the insulating layer 13. The insulating layer 13 is provided on a silicon substrate 1. A silicon oxide film 15 is formed on a surface of the silicon layer 14 so that the bottom of the silicon oxide film 15 defines an upper boundary of the cavity 12. An inter-layer insulator 7 is formed on the silicon oxide layer 5. A first level interconnection 6 is formed on the silicon oxide film 15 and within the inter-layer insulator 7. A contact plug 9 is formed on the first level interconnection 6 and within the inter-layer insulator 7. Second level interconnections 10 are formed on the inter-layer insulator 7. A through hole 11 is formed which penetrates both the inter-layer insulator 7 and the silicon oxide layer 15 so that the through hole 11 reaches the cavity 12 formed in the silicon layer 14. An inductor device 56 comprising the first and second level interconnections 6 and 10 as well as the tungsten contact plug 9 is thus formed over the cavity 12 formed in the silicon layer 14. Namely, the cavity 12 extends under the entire inductor device formation region on which the inductor device 56 is formed. The cavity 12 reduces the parasitic capacitance between the silicon substrate 1 and the first and second level interconnections 6 and 10, thereby improving frequency characteristics of the inductor device 56. Namely, the high frequency performance of the inductor device 56 is improved by the cavity 12. The second level interconnection extends in spiral over the inter-layer insulator. The cavity 12 has a depth of about 100 micrometers. The cavity 12 extends in the form of a mesh so that the meshed shape of the cavity 12 defines squared pillar portions of the silicon layer 14 which are symmetrically distributed in a matrix form. The through hole 11 reaches the cavity 12. The insulating layer 13 has a thickness in the range of 5–10 micrometers. The silicon layer 14 has a thickness in the range of 50–100 micrometers. Each of the square-shaped pillar portions of the silicon layer 14 has a size of 10 micrometers by 10 micrometers. A distance between two adjacent square-shaped pillar portions of the silicon layer 14 is 50 micrometers. The square-shaped pillar portions of the silicon layer 14 are formed in a 7 by 7 matrix so that a total number of the square-shaped pillar portions is 49. An area of the cavity 12 is calculated to be 245100 micrometers squares (=500×500−49×10×10) which is almost the same as the area (250000 micrometers squares= 500×500) of the conventional cavity structure as illustrated in FIG. 1. The reduction of the parasitic capacitance of the semiconductor device depends upon the ratio in area of the cavity to the square-shaped pillar portions of the silicon layer 14, for which reason the above novel semiconductor device has an improved cavity structure that is capable of exhibiting almost the same resonant frequency as the conventional semiconductor device. Further, the square-shaped pillar portions of the silicon layer 14 provide the semiconductor device with a large mechanical strength which prevents the semiconductor device from being broken due to external application of pressure and vibration to the semiconductor device. Furthermore, the insulating layer 13 electrically isolates the square-shaped pillar portions of the silicon layer 14 from the silicon substrate 1, for which reason a further reduction in parasitic capacitance between the inductive device and the silicon substrate can be obtained, whereby a further improvement in high frequency performance of the semiconductor device can be obtained.

The following descriptions will focus on the novel method of forming the above novel semiconductor device with reference to FIGS. 12A through 12E which are fragmentary cross sectional elevation views illustrative of fragmentary cross sectional elevation views illustrative of semiconductor devices in sequential steps involved in a fabrication method.

Figure 12A:
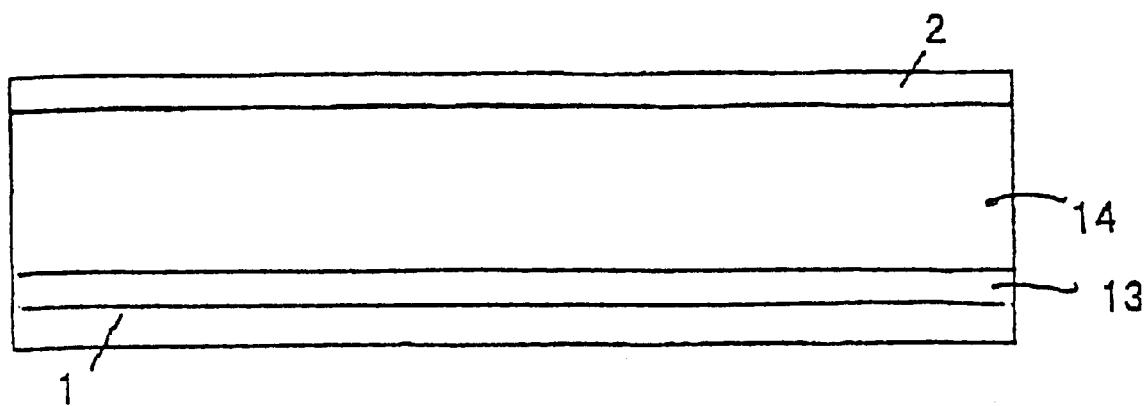
FIGS. 12A through 12E which are fragmentary cross sectional elevation views illustrative of other semiconductor devices in sequential steps involved in a fabrication method in a second embodiment in accordance with the present invention.

With reference to FIG. 12A, an insulating layer 13 having a thickness of 5–10 micrometers is formed on a silicon substrate 1. A silicon layer 14 having a thickness of 50–100 micrometers is formed on the insulating layer 13 formed on a silicon substrate 1 so that the silicon layer 14 is electrically isolated between the insulating layer 13 and the first oxide film 2 having a thickness of 500–1000 nanometers.

Figure 12B:
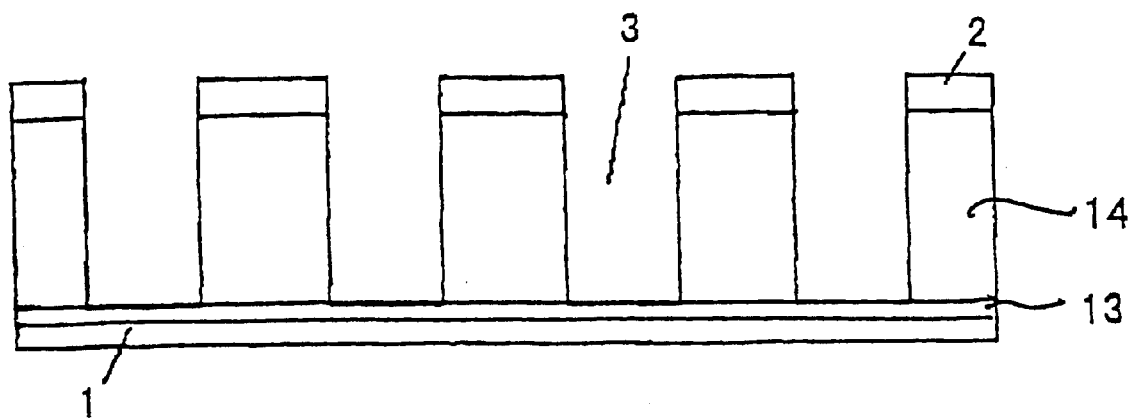

With reference to FIG. 12B, a photo-resist is formed on the first oxide film 2 to carrying out a dry etching to the first oxide film 2 by use of the photo-resist as a mask. The used photo-resist is removed. Subsequently, the first oxide film 2 is used as a mask to carry out a dry etching to the silicon layer 14 to form a trench groove 3 having a width of about 100 micrometers. The trench groove 3 has a plane shape in mesh which defines 7×7 matrix-distribution of the squared pillar portions of the silicon layer 14.

Figure 12C:
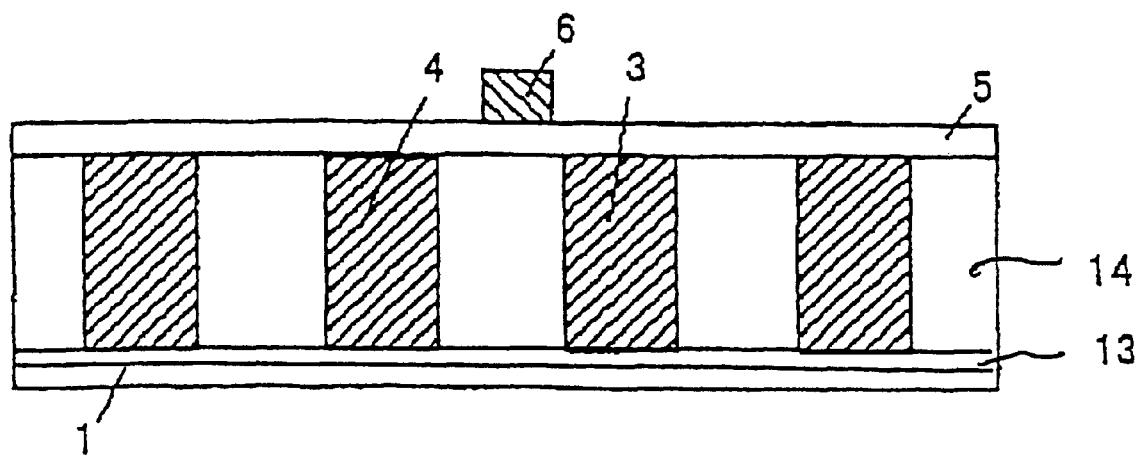

With reference to FIG. 12C, a coating film 4 is filled in the trench groove 3. The coating film 4 may be a spin on glass film. Subsequently, a second oxide film 5 having a thickness of 500–2000 nanometers is formed which extends over the coating film 4 and the top surfaces of the squared pillar portions of the silicon layer 14. A first level interconnection layer 6 is formed on the second oxide film 5.

Figure 12D:
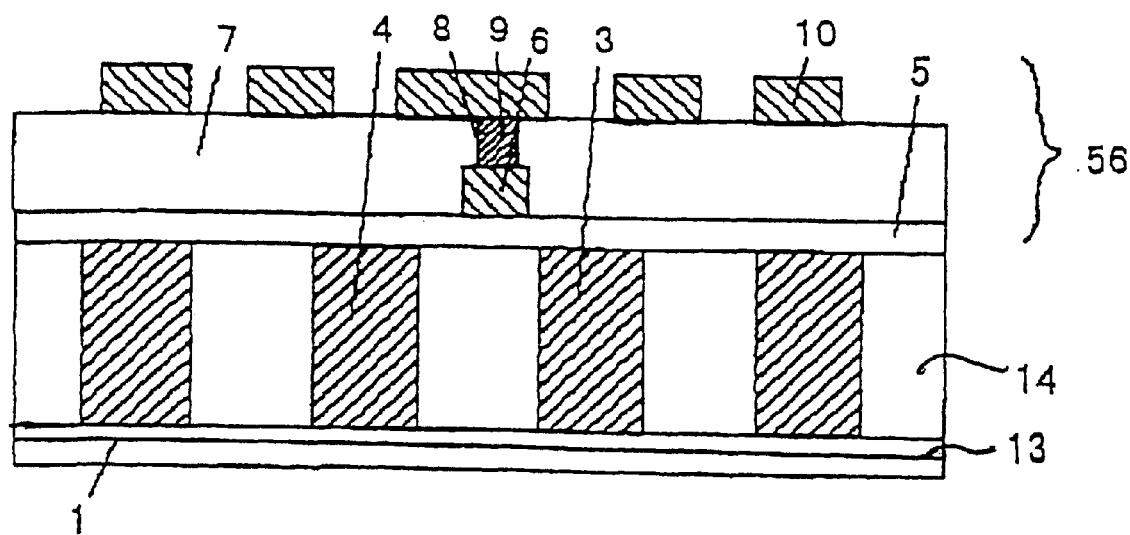

With reference to FIG. 12D, an inter-layer insulator 7 having a thickness of 1000–2000 nanometers is formed on the second oxide film 5 and the first level interconnection layer 6. A surface of the inter-layer insulator 7 is then polished to planarize the surface thereof. A contact hole 8 is formed in the inter-layer insulator 7 so that the contact hole 8 is positioned over the first level interconnection layer 6 and reaches the first level interconnection layer. Tungsten is filled into the contact hole 8 to form a tungsten contact plug 9 in the contact hole 8 so that the tungsten contact plug 9 is in contact with the first level interconnection layer 6. A second level interconnection 10 is formed on the inter-layer insulator 7 so that the second level interconnection is in contact with the tungsten contact plug 9, whereby the second level interconnection 10 is electrically connected through the tungsten contact plug 9 to the first level interconnection layer 6. As a result, an inductor device 56 is formed which comprises the first level interconnection layer 6, the second level interconnection 10 and the tungsten contact plug 9.

Figure 12E:
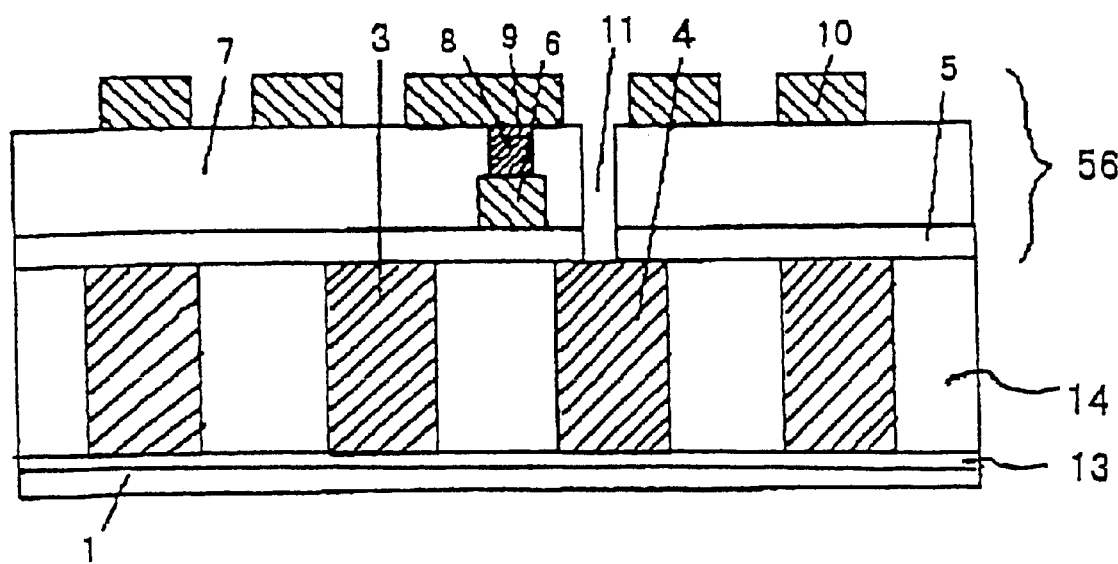

With reference to FIG. 12E, a through hole 11 is formed in the inter-layer insulator 7 and the second oxide film 5 so that the through hole 11 is positioned over the coating film 4 within the groove 3, whereby the coating film 4 within the groove 3 is exposed through the through hole 11. A wet etching of the coating film 4 within the groove 3 is carried out through the through hole 11 by use of a buffered hydrofluoric acid as an etchant. An etching rate of the inter-layer insulator 7 is about 100 times slower than the coating film 4, for which reason only the coating film 4 is selectively etched. Actually, the through hole 11 is enlarged in size by about 1 micrometer through the wet etching process. It is preferable that a plurality of the through holes 11 be formed in the inter-layer insulator 7 so that the etchant is likely to entirely etch the coating film 4 in the trench groove 3, whereby the coating film 4 is removed from the trench groove and the cavity is formed under the inductor device 56.

Namely, the cavity 12 extends completely under the inductor device formation region on which the inductor device 56 is formed. The cavity 12 has a depth of about 100 micrometers. The cavity 12 extends in the form of a mesh so that the meshed shape of the cavity 12 defines squared pillar portions of the silicon layer 14 which are symmetrically distributed in a matrix form. The cavity 12 reduces the parasitic capacitance between the silicon substrate 1 and the first and second level interconnections 6 and 10, thereby improving frequency characteristics of the inductor device 56. Namely, the high frequency performance of the inductor device 56 is improved by the cavity 12. The reduction of the parasitic capacitance of the semiconductor device depends upon the ratio of the area of the cavity 12 to the square-shaped pillar portions of the silicon layer 14, for which reason the above novel semiconductor device has an improved cavity structure which is capable of exhibiting almost the same resonant frequency as the conventional semiconductor device. Further, the square-shaped pillar portions of the silicon layer 14 provide the semiconductor device with a large mechanical strength which prevents the semiconductor device from being broken due to external applications of pressure and vibration to the semiconductor device. The region of the cavity 12 is defined by the anisotropic etching or the dry etching, and it is therefore possible to realize precise control in the area of the cavity 12, thereby enabling the reduction of the parasitic capacitance of the semiconductor device. Therefore, the resonant frequency or the high frequency performance of the semiconductor device is precisely controllable. Furthermore, the insulating layer 13 electrically isolates the square-shaped pillar portions of the silicon layer 14 from the silicon substrate 1, for which reason a further reduction in parasitic capacitance between the inductive device and the silicon substrate can be obtained, whereby a further improvement in high frequency performance of the semiconductor device can be obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A cavity structure in a semiconductor substrate under a device formation region on which a device is formed, the cavity structure including a continuous cavity in the substrate and plural separate supporting pillars in said cavity that each have a generally symmetrical cross section in plan view and that provide the device formation region with mechanical strength.

2. The cavity structure as claimed in claim 1, wherein said supporting pillars comprise an extending portion of said semiconductor substrate so that said supporting pillars are united with the semiconductor substrate and comprise the same semiconductor material as the semiconductor substrate.

3. The cavity structure as claimed in claim 1, further comprising an insulating layer between said supporting pillars and said semiconductor substrate.

4. The cavity structure as claimed in claim 1, wherein said supporting pillars comprise the same semiconductor material as the semiconductor substrate.

5. The cavity structure as claimed in claim 1, wherein said a supporting pillars comprise a different material than the semiconductor substrate.

6. The cavity structure as claimed in claim 1, wherein a distribution of said supporting pillars is generally symmetrical in a plan view of said semiconductor substrate.

7. The cavity structure as claimed in claim 1, wherein each of said supporting pillars is square-shaped in cross sectional plan view.

8. A semiconductor device having an integration of at least one active device and at least one passive device on a single semiconductor substrate, wherein said single semiconductor substrate has a cavity structure as claimed in claim 1.

9. The semiconductor device as claimed in claim 8, further comprising a through hole directly over a part of said cavity structure, except said supporting pillars.

10. A semiconductor device comprising:

a substrate;

a device formation region on said substrate;

a continuous hollow cavity in said substrate beneath an entirety of said device formation region, said hollow cavity separating said device formation region from said substrate; and plural separate pillars in said hollow cavity that each has a generally symmetrical cross section in plan view and extends from a bottom of said cavity to a top thereof and mechanically supports said device formation region.

11. The device of claim 10, wherein said pillars are in a symmetrical matrix.

12. The device of claim 10, wherein the cross section of each of said pillars is square.

13. The device of claim 10, wherein said pillars and said substrate comprise the same material.

14. The device of claim 10, wherein said pillars and said substrate comprise different materials.

15. The device of claim 10, wherein the bottom of said cavity comprises an insulator layer.

16. The device of claim 10, wherein the top of said cavity comprises an insulator layer.

17. The device of claim 10, further comprising a hole that extends through said device formation region to said hollow cavity.

18. The device of claim 10, wherein said device formation region comprises at least one of a capacitor, resistor, and an inductor.

* * * * *